United States Patent
Pfeiffer

(10) Patent No.: US 7,619,257 B2
(45) Date of Patent: Nov. 17, 2009

(54) DEVICES INCLUDING GRAPHENE LAYERS EPITAXIALLY GROWN ON SINGLE CRYSTAL SUBSTRATES

(75) Inventor: Loren Neil Pfeiffer, Harding Township, Morris County, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 215 days.

(21) Appl. No.: 11/355,360

(22) Filed: Feb. 16, 2006

(65) Prior Publication Data
US 2007/0187694 A1    Aug. 16, 2007

(51) Int. Cl.
*H01L 29/15* (2006.01)
(52) U.S. Cl. .................. 257/76; 257/77; 257/E21.128; 257/E21.294; 438/105
(58) Field of Classification Search .................... 257/76, 257/213, 288, 295, 77, E21.128, E21.194; 438/292
See application file for complete search history.

(56) References Cited

U.S. PATENT DOCUMENTS

| | | | | |
|---|---|---|---|---|
| 5,739,563 | A * | 4/1998 | Kawakubo et al. | 257/295 |
| 7,091,096 | B2 * | 8/2006 | Balasubramanian et al. | 438/292 |
| 7,170,120 | B2 * | 1/2007 | Datta et al. | 257/288 |
| 2003/0186059 | A1 * | 10/2003 | Hirata et al. | 428/408 |
| 2004/0253820 | A1 | 12/2004 | DeHeer et al. | 438/689 |
| 2005/0212014 | A1 * | 9/2005 | Horibe et al. | 257/213 |

FOREIGN PATENT DOCUMENTS

WO    WO02081187    10/2002

OTHER PUBLICATIONS

M Wilson, "Electrons in Atomically . . . ," *Phys. Today*, pp. 21-23 (Jan. 2006).
C. Berger et al., "Ultrathin Epitaxial Graphite . . . ," *J. Phys. Chem B*, vol. 108, pp. 19912-19916 (Dec 2004).
M. Hubacek, "Synthesis of Boron Nitride . . . ," available on internet website URL http://hubacek.jp/bn/bn.htm on or before Feb. 9, 2006.

(Continued)

*Primary Examiner*—Thinh T Nguyen
(74) *Attorney, Agent, or Firm*—Michael J. Urbano

(57) ABSTRACT

An electronic device comprises a body including a single crystal region on a major surface of the body. The single crystal region has a hexagonal crystal lattice that is substantially lattice-matched to graphene, and a at least one epitaxial layer of graphene is disposed on the single crystal region. In a currently preferred embodiment, the single crystal region comprises multilayered hexagonal BN. A method of making such an electronic device comprises the steps of: (a) providing a body including a single crystal region on a major surface of the body. The single crystal region has a hexagonal crystal lattice that is substantially lattice-matched to graphene, and (b) epitaxially forming a at least one graphene layer on that region. In a currently preferred embodiment, step (a) further includes the steps of (a1) providing a single crystal substrate of graphite and (a2) epitaxially forming multilayered single crystal hexagonal BN on the substrate. The hexagonal BN layer has a surface region substantially lattice-matched to graphene, and step (b) includes epitaxially forming at least one graphene layer on the surface region of the hexagonal BN layer. Applications to FETs are described.

7 Claims, 2 Drawing Sheets

OTHER PUBLICATIONS

J. W. Matthews et al., "Almost perfect epitaxial multilayers," *J. Vac. Sci Technol.*, vol. 14, No. 4, pp. 989-991 (Jul./Aug. 1977).

K. S. Novoselov et al., "Two-dimensional gas . . . ," *Nature*, vol. 438, pp. 197-200 (Nov. 2005).

Y. Zhang et al., "Experimental observation . . . ," *Nature*, vol. 438, pp. 201-204 (Nov. 2005).

J. D. H. Donnay et al., "Crystal Data, Determinative Tables," 3rd Ed., *US Dept. Comm., NBS*, pp. H256, H259 (1973).

J. Y. Tsao, "Materials Fundamentals of Molecular Beam Epitaxy," *Academic Press, Inc.*, p. 167 (1993).

K. S. Novoselov et al., "Electric Field Effect . . . ," *Science*, vol. 306, pp. 666-669 (Oct 2004).

L. N. Pfeiffer et al., "Ballistic hole transport . . . ," *Appl. Phys. Lett.*, vol. 87, pp. 073111-(1-3) (Sep. 2005).

PCT International Search Report, including transmittal letter, search report and examiner's opinion totaling 12 pages. (Jul. 17, 2007).

C. Oshima, et al., "A hetero-epitaxial-double-atomic-layer system of monolayer graphene/monolayer *h*-BN on Ni(111)," *Solid State Communications*, vol. 116, No. 1, pp. 37-40 (2000).

C. Oshima, et al, "A hetero-epitaxial-multi-atomic-layer system of graphene and *h*-BN," *Surface Review and Letters*, vol. 7, No. 5 & 6, pp. 521-525 (2000).

\* cited by examiner

DEVICES INCLUDING GRAPHENE LAYERS EPITAXIALLY GROWN ON SINGLE CRYSTAL SUBSTRATES

BACKGROUND OF THE INVENTION

1. Field of the Invention

This invention relates to electronic devices that include a layer of graphene.

2. Discussion of the Related Art

In a recent article in *Physics Today* M. Wilson reviews a unique two-dimensional condensed matter system known as graphene, a single, one-atom thick sheet (i.e., a monolayer) of carbon atoms arranged in a honeycomb, hexagonal lattice. Graphene is the building block for graphite-like carbon materials of every other dimensionality. [See, "Electrons in Atomically Thin Carbon Sheets Behave like Massless Particles," *Phys. Today*, p. 21 (January 2006), which is incorporated herein by reference.]

Wilson points out that graphene has rather remarkable properties. First, it is stable, chemically inert, and crystalline under ambient conditions. Second, it is a semimetal in that its conduction and valence bands just meet at discrete points in the Brillouin zone. Third, an electron in graphene has an effective mass of zero and behaves more like a photon than a conventional massive particle. Fourth, it can carry huge current densities—about $10^8$ A/cm$^2$, roughly two orders of magnitude greater than copper.

In the last few years scientists have attempted to create a single 2D graphene sheet in a free state. For example, one group used adhesive tape to peel off weakly bound layers from a graphite crystal, gently rubbed those fresh layers against an oxidized silicon surface, and then identified the relatively few monolayer flakes among the macroscopic shavings. [See, for example, K. S. Novoselov et al., *Science*, Vol. 306, p. 666 (2004), which is incorporated herein by reference. Another group fabricated ultrathin carbon films, typically three graphene sheets, by thermal decomposition of the surface of SiC. The SiC was simply heated sufficiently to evaporate Si from the surface, leaving behind the thin carbon films. [See, C. Berger et al., *J Phys. Chem. B*, Vol. 108, p. 19912 (2004), which is incorporated herein by reference.]

Growing single sheets of graphene, however, remains a problem, according to Wilson the monolayers of carbon are most vulnerable to damage when being heated during typical fabrication processes.

In addition, although Berger et al. refer to their carbon films as having been "grown epitaxially" on SiC, their process actually involved only evaporation of Si; it did not involve "growth" as that term is conventionally used to describe epitaxial deposition in standard fabrication techniques, such as Molecular Beam Epitaxy (MBE) and Chemical Vapor Deposition (CVD). In fact, SiC and graphite have a relatively large lattice-mismatch of about 20%, which is typically much too large for depositing device-quality epitaxial graphite layers on a SiC substrate.

In a preliminary demonstration of device potential, Berger et al. reported that the resistance modulation of a large-area gated graphitic channel FET structure at cryogenic temperatures (4 K) was rather small (only 2%) because the gate covered only a portion of the graphite film between the source and drain electrodes, leaving large ungated leakage paths.

The Berger et al. device is also described by W. A. DeHeer et al. in US Patent Application No. 2005/0253820 published on Dec. 16, 2004.

Thus, a need remains in the art for graphene-based devices in which graphene is epitaxially deposited on a suitable, lattice-matched substrate.

BRIEF SUMMARY OF THE INVENTION

In accordance with one aspect of my invention, an electronic device comprises a body including a single crystal region on a major surface of the body, the region having a hexagonal crystal lattice that is substantially lattice-matched to graphene, and at least one epitaxial layer of graphene disposed on the region. In a currently preferred embodiment, the single crystal surface region comprises multi-layered hexagonal BN, which has the requisite hexagonal crystal lattice within each layer and has less than about a 2% lattice mismatch to graphene. In addition, it is also preferred that only a single layer of graphene is disposed on the region. In accordance with another aspect of my invention, a method of making an electronic device comprises the steps of: (a) providing a body including a single crystal region on a major surface of the body, the region having a hexagonal crystal lattice that is substantially lattice-matched to graphene, and (b) epitaxially forming at least one graphene layer on that region. In a currently preferred embodiment, step (a) further includes the steps of (a1) providing a single crystal substrate of graphite and (a2) epitaxially forming single crystal hexagonal BN on the substrate. The hexagonal BN has a surface region, which has a multi-layered, hexagonal crystal lattice within each layer and is substantially lattice-matched to graphene, and step (b) includes epitaxially forming the graphene layer on the hexagonal BN surface region.

BRIEF DESCRIPTION OF THE SEVERAL VIEWS OF THE DRAWING

My invention, together with its various features and advantages, can be readily understood from the following more detailed description taken in conjunction with the accompanying drawing, in which.

As used herein, the meaning of "in" includes "in" and "on," and the meaning of "on" includes "on" and "in."

DETAILED DESCRIPTION OF THE INVENTION

Figure 1:
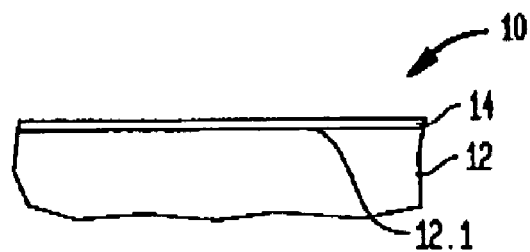
FIG. 1 is a schematic, cross sectional view of an electronic device 10 in accordance with one embodiment of my invention.

With reference now to FIG. 1, an electronic device 10 comprises a body 12 having a single crystal region 12.1 on a major surface of the body 12. The region 12.1 has a hexagonal crystal lattice that is substantially lattice-matched to graphene, and at least one layer 14 of graphene epitaxially disposed on region 12.1. Preferably, only a single layer of graphene is formed on region 12.1. A single graphene layer avoids complications associated with defects between multiple layers. However, my invention contemplates having more than one layer of graphene disposed on the substrate. Whether multiple graphene layers are practical depends to a large extent on the intended device application. For example, in devices (e.g., FETs discussed infra) in which multiple graphene layers might have to be depleted (e.g., when a portion of the graphene layers form an FET channel), the semi-metal nature of graphene may make it difficult to achieve sufficient depletion in more than, say, two or three graphene layers.

Figure 5:
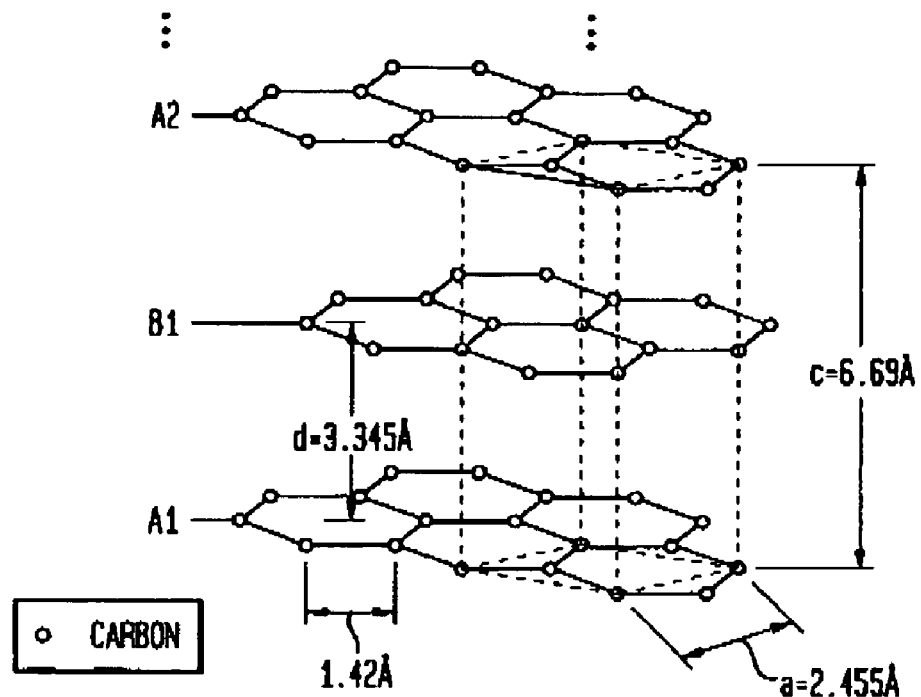
FIG. 5 shows the multi-layered, crystallographic structure of graphite. In the interests of simplicity and clarity only three layers of graphene are depicted. Graphite may have more or less than three graphene layers.

Body 12 may be entirely single crystal material, or it may be a composite of single crystal and non-single-crystal materials, as long as surface region 12.1 is single crystalline and has the requisite lattice match and hexagonal crystal lattice. More specifically, FIG. 5 shows the crystallographic structure of graphite, which exhibits two principal features: first, it is composed of a multiplicity of stacked layers (i.e., planes or sheets) A1, B1, A2 etc. of graphene; and second, each layer has a hexagonal crystal lattice of carbon atoms (open circles), one at each apex of the hexagons. As indicated, the crystallographic dimension a=2.455 Å is the distance between non-adjacent pairs of carbon atoms (i.e., between odd numbered atoms, or between even numbered atoms) in each hexagon, the bond length b=1.42 Å is the distance between adjacent atoms, and d=3.345 Å is the distance between adjacent graphene layers.

Therefore, the crystallographic structure of single crystal region 12.1 should be substantially identical to that of graphite. As noted above, first, it is preferably multi-layered in the same or a very similar fashion as layers A1, B1, A2 etc. of graphite; second, it should have a hexagonal crystal lattice within each layer; and third, it should have the same or very similar bond lengths, especially the size of the crystallographic dimension a. Preferably, the single crystal region 12.1 should belong to the same crystallographic space group as graphene (i.e., the $P6_3/mmc$ group of graphite).

By requiring that graphene layer(s) 14 and region 12.1 are substantially lattice-matched to one another we mean that the lattice mismatch between them is not greater than about 2%. Since the lattice constant $a_g$ of graphite, and hence of graphene, is about 2.455±0.002 Å[See, "Crystal Data, Determinative Tables," $3^{rd}$ Ed., I. D. H. Donnay et al., US Department of Commerce, National Bureau of Standards (1973)], the corresponding lattice constant $a_r$ of region 12.1 should be approximately $$0.98a_g \leq a_r \leq 1.02a_g; \quad (1)$$

that is, $$2.4059 \leq a_r \leq 2.5041 \quad (2)$$

Figure 6:
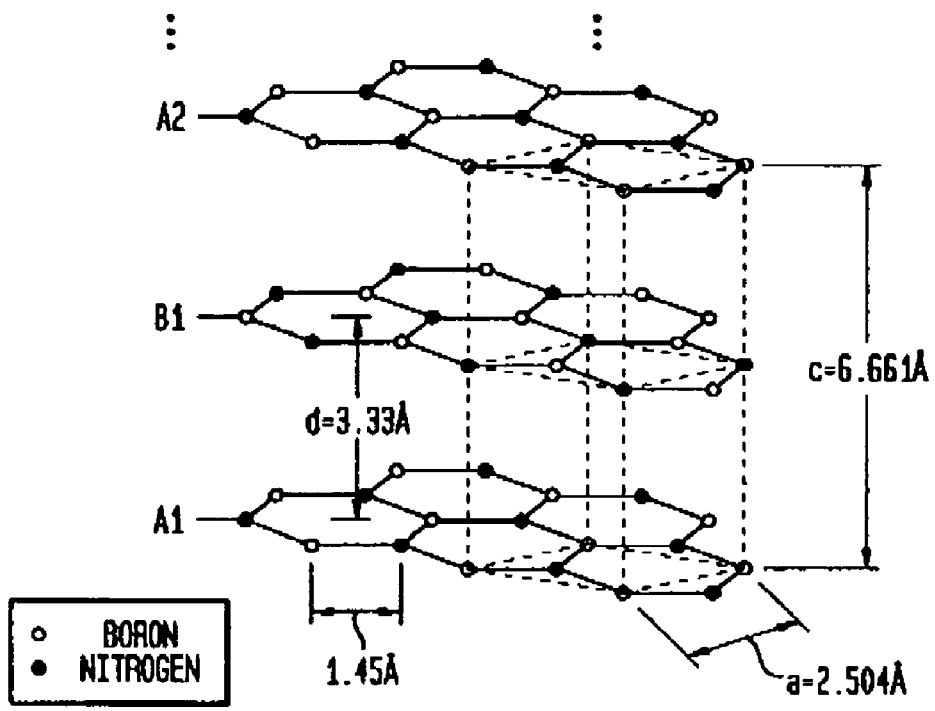
FIG. 6 shows the multi-layered, crystallographic structure of multi-layered, single crystal, hexagonal boron nitride (BN). In the interests of simplicity and clarity only three layers of hexagonal BN are depicted. Hexagonal BN may have more or less than three graphene layers.

As shown in FIG. 6, multi-layered hexagonal boron nitride (BN) has a hexagonal lattice nearly identical to that of graphite, and it belongs to the same space group ($P6_3/mmc$) as graphite. In addition, it has a lattice constant $a_b$=2.50399±0.00005 Å (both of the latter two properties according to Donnay et al., supra), which satisfies inequality (2). Furthermore, this form of hexagonal BN has a bond length b=1.45 Å and a layer separation d=3.33 Å, both of which are very close to that of graphene. Therefore, this type of BN can be used to form region 12.1 provided that it can be fabricated as a single crystal.

Hexagonal, multi-layered, single crystal BN is described by M. Hubacek in an article entitled "Synthesis of Boron Nitride from Oxide Precursors," which can found on the Internet at URL http://hubacek.jp/bn/bn.htm, pp. 1-10 (February 2006) and is incorporated herein by reference.

Figure 2:
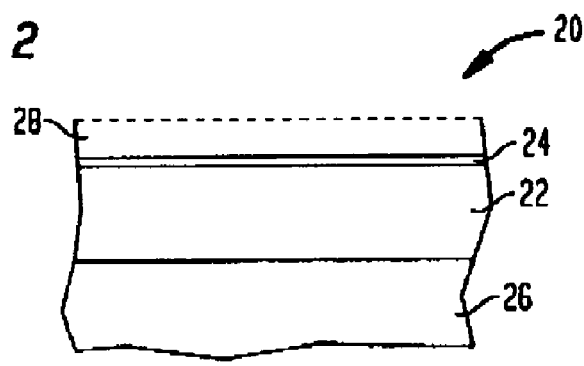
FIG. 2 is a schematic, cross sectional view of an electronic device 20 in accordance with another embodiment of my invention.

Alternatively, and in accordance with another aspect of my invention, the crystallographic requirements are addressed as follows. With reference to FIG. 2, an electronic device 20 is fabricated by first providing a single crystal graphite substrate 26. Preferably, substrate 26 is highly ordered graphite (known as HOG) in which the normals to adjacent graphite planes are essentially parallel; that is, the angle between adjacent normals is no more than 0.4°, and preferably no more than about 0.2°. Using standard CVD techniques, a hexagonal BN layer 22 is epitaxially deposited on graphite substrate 26. This step results in multi-layered hexagonal BN that has substantially the same hexagonal crystal lattice as the underlying graphite substrate 26. Then, graphene layer(s) 24 is epitaxially deposited on the top major surface 22.1 of single crystal hexagonal BN layer 22, which corresponds to surface region 12.1 of FIG. 1. Graphene layer(s) 24 may be deposited by any of several well-known techniques; for example, by MBE, which provides sub-monolayer control of layer thickness, using a vitreous carbon source of the type described by me and K. W. West in copending U.S. patent application Ser. No. 11/114,828 filed on Apr. 26, 2005, which is incorporated herein by reference; or by CVD. Low pressure CVD (LPCVD) affords better thickness control than other forms of CVD and, therefore, may be preferred.

Once the multi-layered, single crystal hexagonal BN layer 22 has been grown, the graphite substrate 26 may be removed partially or in its entirety. However, such removal of the graphite substrate 26 may be delayed until further processing steps have been completed; e.g., after the graphene layer(s) 24 has been grown on the hexagonal BN layer 22, or after an optional insulative layer 28 has been deposited on graphene layer(s) 24.

At this point, note, because a graphene layer is only a single monolayer thick, there is little risk that any significant number of dislocations, if any, will form during the growth of no more than a few layers of graphene. That is, the Matthews-Blakeslee theory predicts that the dislocation-free layer thickness is inversely related to the lattice mismatch between the grown layer and the underlying substrate. Thus, for example, if the lattice mismatch is 1%, a layer can be grown 100 Å thick without forming dislocations, but if the mismatch is doubled to 2%, the layer can be grown only 40 Å thick without dislocations. [See, J. Y. Tsao, "Materials Fundamentals of Molecular Beam Epitaxy," p. 167, Academic Press, Inc. (1993).] But, since a graphene layer is nominally only about 2 Å thick, a lattice mismatch of 2% can be well tolerated.

Although a graphene layer may be epitaxially grown on any lattice-matched material, for many electronic applications the material of region 12.1, 22.1 is preferably not highly conductive; e.g., it is an insulator or a semiconductor having a relatively large band gap. Hexagonal BN falls into this category. In many FET designs, for example those depicted in FIGS. 3-4, the graphene layers 34, 44 are grown on, and lattice-matched to, insulative layers 32, 42, respectively.

Figure 3:
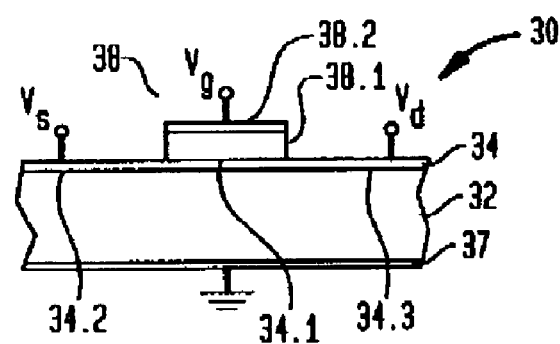
FIG. 3 is a schematic, cross-sectional view of a FET 30 in accordance with one more embodiment of my invention.

In addition, the optional insulative layer 28 is important in the design of many electronic devices; for example, in building the gate structure (in particular, the gate insulator 38.1) of FETs of the type shown in FIG. 3. Preferably, insulative layer 28 is epitaxially deposited on graphene layer(s) 24 and has the same crystallographic properties as layer 22. Thus, multi-layered, single crystal hexagonal BN is a preferred material for fabricating layer 28, and it can be deposited using the same techniques used for layer 22. In addition, however, many applications, including the FET of FIG. 3, require that layer 28 be patterned, either as it is being deposited (e.g., by well-known shadow masking) or after it has been deposited (e.g., by well-known lift off or lithographic etching).

The use of multi-layered, single crystal hexagonal BN for both insulative layers 22 and 28 reduces the number of possibly electrically active interface states between these layers and graphene layer 24, a feature that is particularly important in the operation of many FETs.

More specifically, in FIG. 3 the FET 30 is formed by a stack of layers including a single crystal insulative layer 32 and a graphene layer 34 epitaxially formed thereon. Separate portions of layer 34 form source region 34.2 and drain region 34.3. Schematically depicted source and drain electrodes $V_s$ and $V_d$, respectively, make electrical contact with source and drain regions 34.2 and 34.3. A third portion of layer 34 forms a channel region 34.1, which couples the source and drain regions to one another. As is well known in the semiconductor and graphene device arts, the resistance/conductance of the channel region 34.1 is controlled by a gate region 38. The latter comprises a patterned gate insulator 38.1 disposed on channel region 34.1 and a gate electrode 38.2 formed on gate insulator 38.1. The gate insulator is may be patterned from any insulator, or it may be patterned from a broad area insulator epitaxially grown on graphene layer 34, or it may be patterned as it is being deposited using a standard shadow mask, as discussed above with reference to layer 28 of FIG. 2. Finally, a common (often grounded) electrode 37 is formed on the bottom of insulative layer 32. Note, FIG. 3 is a schematic cross-section, which does not reflect the fact that no conductive path exists between the source and drain regions except for the path under gate region 38 and through channel region 34.1.

In operation, when suitable voltages $V_s$ and $V_d$ are applied to the source and drain electrodes, respectively, current flows or is inhibited from the source region 34.2 to the drain region 34.3 (or conversely) depending on the gate voltage applied between electrodes 38.2 and 37. When the gate voltage $V_g$ is sufficient to reduce electron transport by depleting the channel region 34.1, the channel resistance increases and current flow decreases, and conversely.

Figure 4:
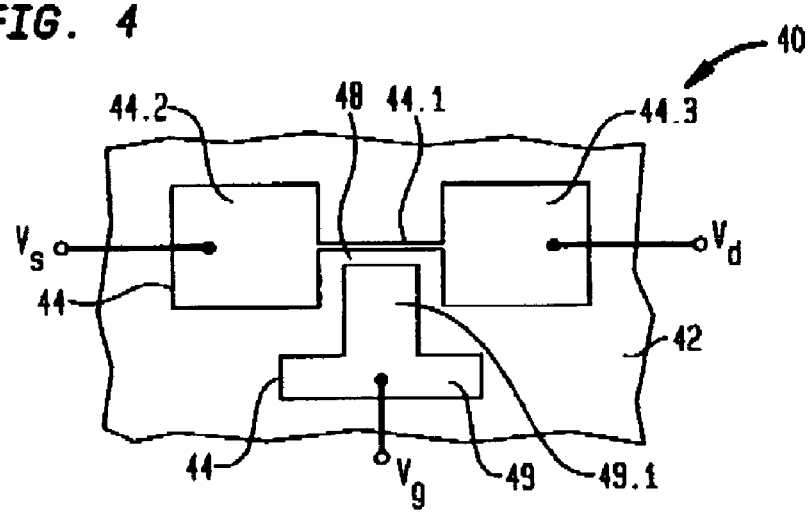
FIG. 4 is a schematic, top view of a FET 40 in accordance with yet another embodiment of my invention.

On the other hand, in FIG. 4 the FET 40 is formed in a planar fashion by a patterned graphene layer 44 epitaxially formed on an insulative layer 42. In this embodiment, rectangular source region 44.2 and rectangular drain region 44.3 are coupled to one another by strip-like channel region 44.1, all of which are patterned portions of graphene layer 44. In this case the T-shaped gate electrode 49 is also a patterned portion of graphene layer 44. (Shapes other than rectangles, strips and T's may be suitable.) The gate electrode 49 has a segment 49.1 that extends to close proximity with channel region 44.1. Insulator region 48, which is a surface portion of insulative layer 42, serves as the gate insulator separating channel region 44.1 from gate electrode segment 49.1.

In operation, the embodiment of FIG. 4 follows the same principles as the embodiment of FIG. 3, except that a common electrode (akin to electrode 37 of FIG. 3) is not required. Rather, the gate voltage $V_g$ may be applied between the gate electrode 49 and the source or drain regions 44.2, 44.3.

It is to be understood that the above-described arrangements are merely illustrative of the many possible specific embodiments that can be devised to represent application of the principles of the invention. Numerous and varied other arrangements can be devised in accordance with these principles by those skilled in the art without departing from the spirit and scope of the invention.

In particular, as discussed earlier, the FETs of FIGS. 3-4 are not restricted to the use of a single graphene layer to form the channels, although that design is currently preferred. Several (e.g., two or three) graphene layers may be used provided that they can be sufficiently depleted to control the flow of current between the source and drain.

In addition, electrodes may be formed on graphene layers 34, 44 by electron beam lithography followed by evaporation of Au/Cr, as described by Y. Zhang et al., *Nature*, Vol. 438, No. 10, p. 201 (November 2005), which is incorporated herein by reference.

I claim:

1. A device comprising:
    a body including a single crystal, electrically insulative first region on a major surface of said body, said first region having a hexagonal crystal lattice substantially lattice-matched to graphene,
    at least one epitaxial layer of graphene disposed on said first region of said body, and
    a multi-layered, single crystal, electrically insulative second region disposed on said at least one graphene layer, said second region having a hexagonal crystal lattice within each layer thereof and being substantially lattice-matched to graphene.

2. The device of claim 1, wherein said first region comprises a multi-layered single crystal insulator or a wide band gap semiconductor.

3. The device of claim 2, wherein said insulator comprises single crystal hexagonal BN.

4. The device of claim 2, wherein said body further includes a substrate of single crystal graphite, said first region being disposed on a major surface of said graphite substrate.

5. The device of claim 1, wherein said region and said at least one graphene layer are lattice-mismatched by less than about 2%.

6. The device of claim 5, wherein said first region and said at least one graphene layer have the same crystallographic space group.

7. A field effect transistor comprising,
    a source region, a drain region, and a channel region coupling said source and drain regions to one another, and
    a gate region configured to apply voltage to said channel region, thereby controlling the flow of current between said source in drain regions, and
    the device of claim 1, wherein said channel region includes a portion of said at least one grapheme layer.

* * * * *

UNITED STATES PATENT AND TRADEMARK OFFICE
CERTIFICATE OF CORRECTION

| | | |
|---|---|---|
| PATENT NO. | : 7,619,257 B2 | Page 1 of 1 |
| APPLICATION NO. | : 11/355360 | |
| DATED | : November 17, 2009 | |
| INVENTOR(S) | : Loren Neil Pfeiffer | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 386 days.

Signed and Sealed this

Fourteenth Day of December, 2010

David J. Kappos
*Director of the United States Patent and Trademark Office*